United States Patent
Kwon et al.

(10) Patent No.: US 9,911,751 B2
(45) Date of Patent: Mar. 6, 2018

(54) MANUFACTURING METHOD FOR SEMICONDUCTOR DEVICE HAVING HOLE PENETRATING STACK STRUCTURE

(71) Applicant: SK hynix Inc., Gyeonggi-do (KR)

(72) Inventors: Woo June Kwon, Gyeonggi-do (KR); Jong Hoon Kim, Gyeonggi-do (KR); Chan Sun Hyun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/155,937

(22) Filed: May 16, 2016

(65) Prior Publication Data
US 2017/0179148 A1    Jun. 22, 2017

(30) Foreign Application Priority Data
Dec. 21, 2015 (KR) .......................... 10-2015-0182876

(51) Int. Cl.
| | |
|---|---|
| *H01L 21/336* | (2006.01) |
| *H01L 27/11582* | (2017.01) |
| *H01L 27/11565* | (2017.01) |
| *H01L 27/11568* | (2017.01) |
| *H01L 23/528* | (2006.01) |
| *H01L 23/522* | (2006.01) |
| *H01L 21/768* | (2006.01) |

(52) U.S. Cl.
CPC .. *H01L 27/11582* (2013.01); *H01L 21/76816* (2013.01); *H01L 21/76829* (2013.01); *H01L 21/76877* (2013.01); *H01L 23/528* (2013.01); *H01L 23/5226* (2013.01); *H01L 27/11565* (2013.01); *H01L 27/11568* (2013.01)

(58) Field of Classification Search
CPC ......... H01L 27/11582; H01L 21/76877; H01L 21/76829; H01L 21/76816; H01L 23/528; H01L 27/11568; H01L 27/11565; H01L 23/5226
See application file for complete search history.

(56) References Cited

U.S. PATENT DOCUMENTS

| | | | | |
|---|---|---|---|---|
| 2006/0284228 A1* | 12/2006 | Lee | .......................... | H01L 29/94 257/301 |
| 2012/0276719 A1* | 11/2012 | Han | ..................... | H01L 29/7926 438/478 |
| 2014/0112049 A1* | 4/2014 | Jung | ................. | H01L 29/66833 365/72 |

FOREIGN PATENT DOCUMENTS

| | | |
|---|---|---|
| KR | 1020010061017 | 7/2001 |
| KR | 1020120003351 | 1/2012 |
| KR | 1020120041334 | 5/2012 |

* cited by examiner

*Primary Examiner* — Thanh Y Tran
(74) *Attorney, Agent, or Firm* — IP & T Group LLP (57) ABSTRACT

A manufacturing method for a semiconductor device includes forming a first stacked structure, forming a first hole penetrating the first stacked structure, forming a reflective metal pattern in the first hole, filling an etch stop layer in the first hole and over the reflective metal pattern, forming a second stacked structure over the first stacked structure, and forming a second hole penetrating the second stacked structure to expose the etch stop layer.

12 Claims, 9 Drawing Sheets

MANUFACTURING METHOD FOR SEMICONDUCTOR DEVICE HAVING HOLE PENETRATING STACK STRUCTURE

CROSS-REFERENCE TO RELATED APPLICATION

The present application claims a priority to Korean patent application number 10-2015-0182876 filed on Dec. 21, 2015, the disclosure of which is herein Incorporated by reference in its entirety.

BACKGROUND

1. Field

An aspect of the present disclosure relates to a manufacturing method for a semiconductor device, and more particularly, to a manufacturing method for a semiconductor device including a three-dimensional memory device.

2. Description of the Related Art

A semiconductor device may include a plurality of memory cells capable of storing data. A three-dimensional memory device has been proposed in order to achieve a high degree of integration of semiconductor devices. The three-dimensional memory device includes three-dimensionally arranged memory cells.

The memory cells of the three-dimensional memory device may be stacked on each other. In a unit cell string, the memory cells may be connected to each other in series through a channel layer. The degree of integration of the three-dimensional memory device may increase as the number of stacked memory cells increases. However, as the number of stacked memory cells increases, the degree of difficulty of a manufacturing process of the three-dimensional memory device increases and defects are more likely to occur.

SUMMARY

According to an aspect of the present disclosure, there is provided a method for manufacturing a semiconductor device, the method including: forming a first stacked structure; forming a first hole penetrating the first stacked structure; forming a reflective metal pattern in the first hole; filling an etch stop layer in the first hole and over the reflective metal pattern; forming a second stacked structure over the first stacked structure; and forming a second hole penetrating the second stacked structure to expose the etch stop layer.

According to an aspect of the present disclosure, there is provided a method for manufacturing a semiconductor device, the method including: repeatedly stacking a first material layer and a second material layer to form a first stack structure; forming a first hole passing through the first stack structure; forming an overlay measurement pattern in the first hole, wherein the overlay measurement pattern includes a different material from the first material layer and the second material layer; forming an etch stop layer in the first hole and over the overlay measurement pattern; repeatedly stacking a third material layer and a fourth material layer over the first stack structure to form a second stack structure; and forming a second hole passing through the second stack structure to expose the etch stop layer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 2A to 68 are cross-sectional views illustrating a manufacturing method for a semiconductor device according to an embodiment of the present disclosure.

DETAILED DESCRIPTION

Hereinafter, exemplary embodiments of the present disclosure will be described in detail with reference to the accompanying drawings. However, the present disclosure is not limited to the embodiments but may be implemented in different forms. These embodiments are provided only for illustrative purposes and for full understanding of the scope of the present disclosure by those skilled in the art. Further, the scope of the present disclosure should be understood within the scope of the present disclosure defined by the appended claims.

Embodiments provide a manufacturing method for a semiconductor device, which can decrease the degree of difficulty for a manufacturing process of a three-dimensional memory device and the defect rate of the process.

Figure 1A:
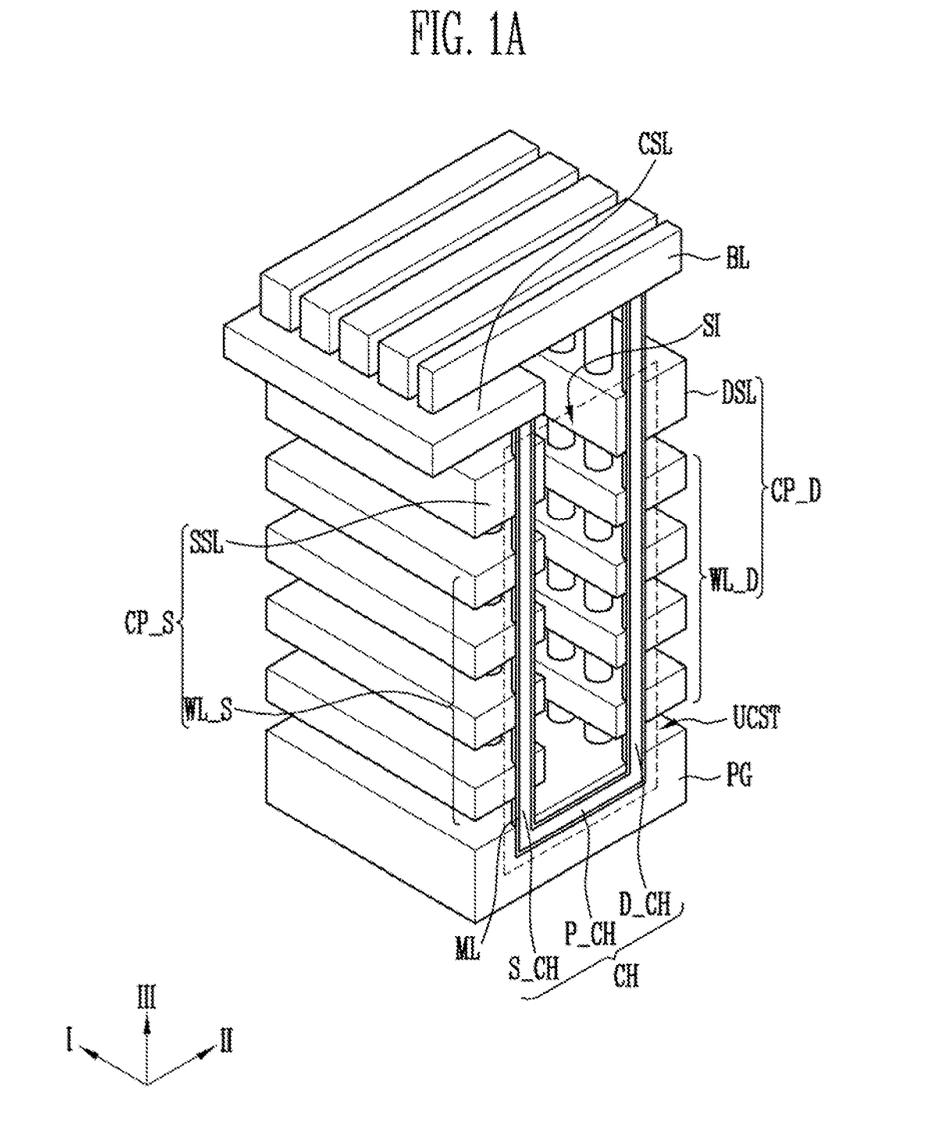
FIGS. 1A to 1C are perspective views illustrating semiconductor devices according to embodiments of the present disclosure.
Figure 1B:
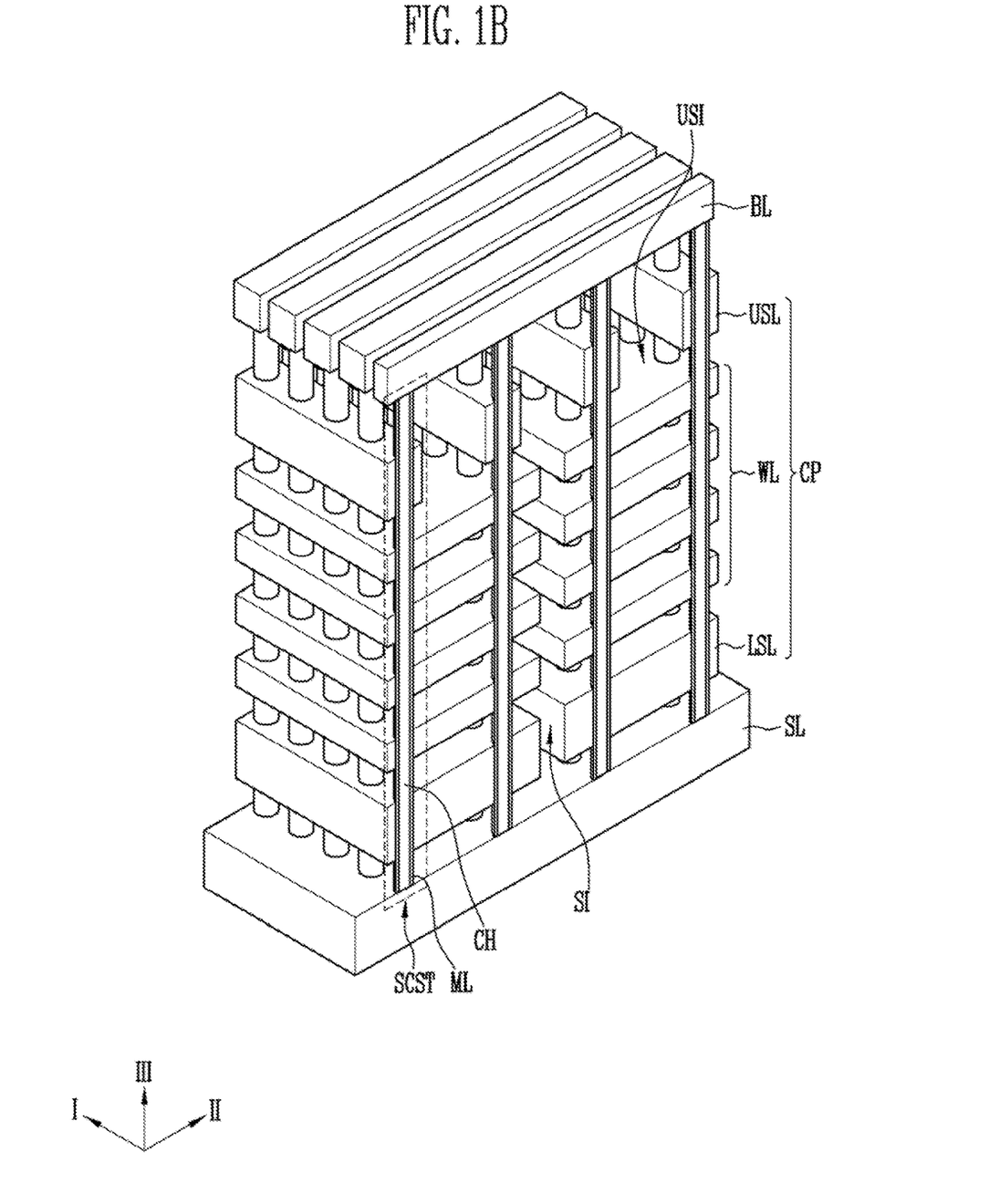
Figure 1C:
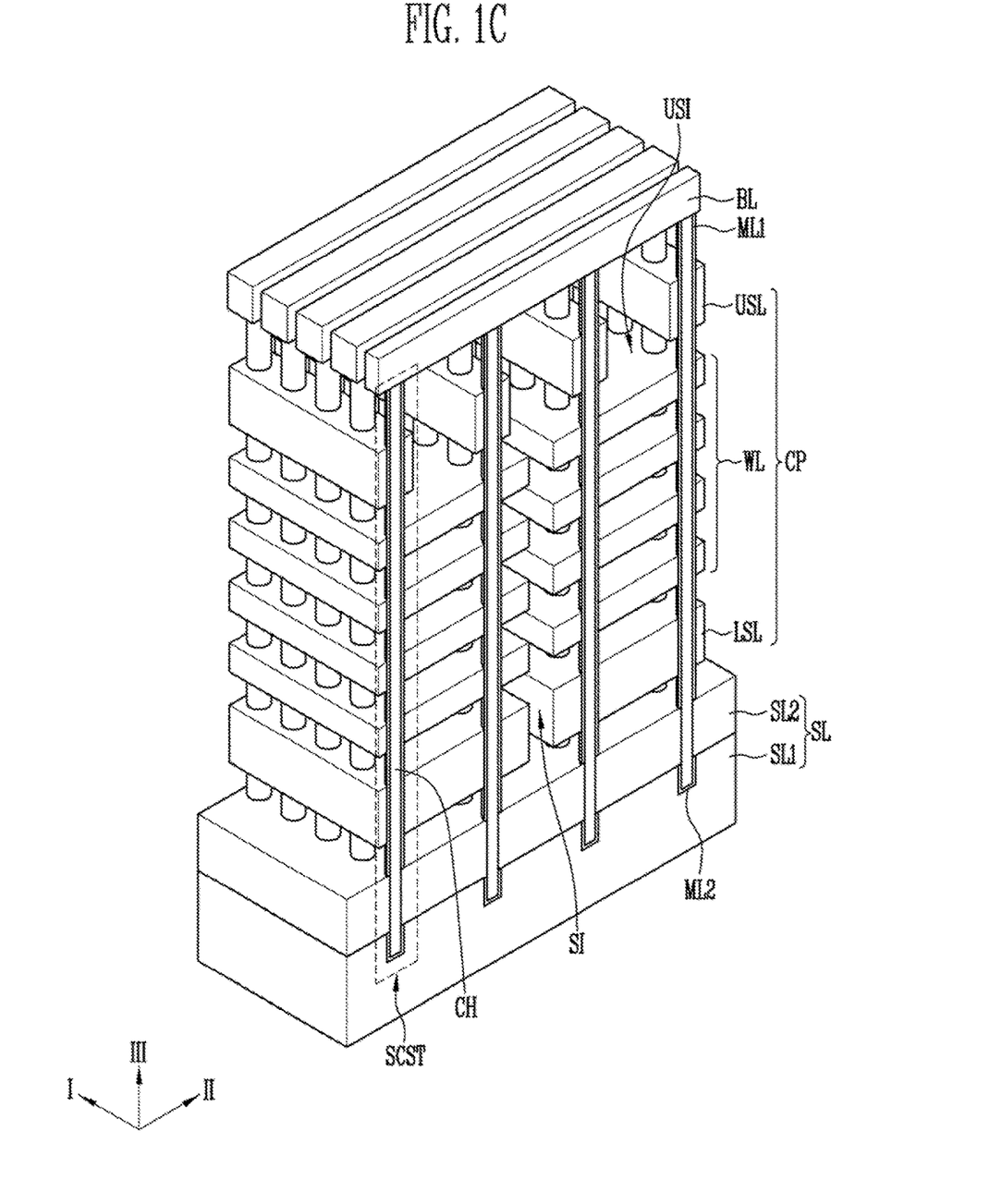

FIGS. 1A to 1C are perspective views illustrating semiconductor devices according to embodiments of the present disclosure. For conciseness of description, in FIGS. 1A to 1C, a multi-layered stack is schematically show The interlayer insulating layers are, not shown in FIGS. 1A to 1C.

Each of the semiconductor devices according to the embodiments of the present disclosure may include memory blocks formed in a memory cell array region. Each of the memory blocks may include a plurality of cell strings. Each of the cell strings may be formed into various structures. In order to achieve a high degree of integration of the semiconductor device, each of the cell strings may be formed into a three-dimensional structure.

Referring to FIG. 1A, each of the cell strings may be configured as a U-type cell string UCST. The U-type cell string UCST may include a U-type string channel layer CH, conductive patterns CP_S and CP_D surrounding the channel layer CH, the conductive patterns CP_S and CP_D spaced apart from each other, and a pipe gate PG disposed under the conductive patterns CP_S and CP_D and surrounding part of the string channel layer CH.

The string channel layer CH may include a pipe channel layer P_CH embedded inside the pipe gate PG, a source-side channel layer S_CH, and a drain-side channel layer D_CH. The source-side channel layer S_CH and the drain-side channel layer D_CH extend from the pipe channel layer P_CH, The string channel layer CH may be formed in a tubular shape surrounding a core insulating layer filled in a central region of a U-shaped hole, or may fill in the central region of the U-shaped hole.

The outer wall of the string channel layer CH may be surrounded by a multi-layered stack ML which includes a tunnel insulating layer, a data storage layer, and a blocking insulating layer The tunnel insulating layer is in contact with the outer wall of the string channel layer CH and may be formed in a liner shape. The data storage layer is in contact with the outer wall of the tunnel insulating layer and may be formed in a liner shape. The blocking insulating layer is in contact with the outer wall of the data storage layer and may be in a liner shape. Although not shown in this figure, the multi-layered stack ML may be formed (i) between the conductive patterns CP_S and the source-side channel layer CH, (ii) between and CP_D and the drain-side channel layer CH, and (iii) over upper and lower surfaces of each of the conductive patterns CP_S and CP_D. In this case, the multi-layered stack ML is separated by a slit SI, to have a C-shaped section.

The string channel layer CH may be electrically connected between a common source line CSL and a bit line BL. The bit line BL and the common source line CSL are disposed at different levels from each other and are spaced apart from each other. For example, the common source line CSL may be disposed at a lower level than the bit line BL. The bit line BL is electrically connected to a top end of the drain side channel layer D_CH and may extend along a second direction II intersecting a first direction I. A contact plug may be formed between the bit line BL and the drain-side channel layer D_CH. The common source line CSL may be electrically connected to a top end of the source-side channel layer S_CH. A contact plug may be formed between the common source line CSL and the source-side channel layer S_CH.

The pipe gate PG is disposed at a level lower than the bit line BL, the common source line CSL, and the conductive patterns CP_S and CP_D, and may be formed to surround the pipe channel layer P_CH.

The conductive patterns CP_S and CP_D may include source-side conductive patterns CP_S and drain-side conductive patterns CP_D, which are separated by the slit SI. Each of the source-side conductive patterns CP_S and the drain-side conductive patterns CP_D may be disposed at a level lower than the bit line BL and the common source line CSL.

The source-side conductive patterns CP_S may include source-side word lines WL_S and a source select line SSL. The source select line SSL is formed over source-side word lines WL_S. The source-side word lines WL_S may be disposed between the common source line CSL and the pipe gate PG. The source select line SSL may be disposed between the common source line CSL and the source-side word lines WL_S. The number of source select lines SSL stacked between the common source line CSL and the source-side word lines WL_S may be one, two or more.

The drain-side conductive patterns CP_D may include drain-side word lines WL_D and a drain select line DSL. The drain-side word lines may be disposed between the bit line BL and the pipe gate PG. The drain select line. DSL may be disposed between the bit line BL and the drain-side word lines WL_D. The number of drain select lines DSL stacked between the bit line BL and the drain-side word lines WL_D may be one, two or more.

According to the above-described structure, source-side memory cells are formed at an intersection of the source-side channel layer S_CH and the source-side word lines WL_S. Drain-side memory cells are formed at an intersection of the drain-side channel layer D_CH and the drain-side word lines WL_S. A source select transistor is formed at an intersection of the source-side channel layer S_CH and the source select line SSL, and a drain select transistor is formed at an intersection of the drain-side channel layer D_CH and the drain select line DSL. A pipe transistor is formed at an intersection of the pipe channel layer P_CH and the pipe gate PG.

The source select transistor, the source-side memory cells, the pipe transistor, the drain-side memory cells, and the drain select transistor are arranged along one string channel layer CH and may be connected to each other in series through the string channel layer CH. Accordingly, the source select transistor, the source-side memory cells, the pipe transistor, the drain-side memory cells, and the drain select transistor are connected through the string channel layer CH and may define a U-type memory string UCST.

The source-side word lines WL_S may transmit signals to gates of the source-side memory cells, and the drain-side word lines WL_D may transmit signals to gates of the drain-side memory cells. The source select line SSL may transmit signals to a gate of the source select transistor, and the drain select line DSL may transmit signals to a gate of the drain select transistor. The pipe gate PG may transmit signals to a gate of the pipe transistor.

The string channel layer CH may be formed as various structures such as a W-type structure or the U-type structure described above. The arrangement of memory cells may vary depending on the structures of the string channel layer CH. Accordingly, the structure of the memory string can be formed in various forms.

Referring to FIGS. 1B and 1C, each of the memory blocks may include a straight-type cell string SCST. The straight-type cell string SCST may include a straight-type string channel layer CH and conductive patterns CP surrounding the string channel layer CH the conductive patterns being stacked and spaced apart from each other.

The string channel layer CH may be electrically connected between a source layer SL and a bit line BL. The string channel layer CH is formed inside a vertical hole penetrating the conductive patterns CP. The string channel layer CH may be formed in a tubular shape and surround a core insulating layer which is disposed in a central region of the vertical hole. In another embodiment, the string channel layer CH may be formed in an embedded shape which completely fills in the central region of the vertical hole.

As shown in FIG. 1B a top surface of the string channel layer CH may be connected to the bit line BL, and a bottom surface of the string channel layer CH may be connected to the source layer SL. The string channel layer CH may be in contact with a top surface of the source layer SL and extend to the bit line BL.

The outer wall of the string channel layer CH may be surrounded by a multi-layered stack ML. The multi-layered stack ML includes a tunnel insulating layer, a data storage layer, and a blocking insulating layer. The tunnel insulating layer is in contact with the outer wall of the string channel layer CH and may be formed in a liner shape. The data storage layer is in contact with the outer wall of the tunnel insulating layer and may be formed in a liner shape. The blocking insulating layer is in contact with the outer wall of the data storage layer and may be in a liner shape.

Although not shown in this figure, the multi-layered stack ML may be formed (i) between a sidewall of each of the conductive patterns CP and the string channel layer CH and (ii) over upper and lower surfaces of each of the conductive patterns CP. The multi-layered stack ML is separated from each other by slits SI and USI and has a C-shaped section.

The source layer SL shown in FIG. 1B may be a portion of a semiconductor substrate doped with a dopant, or may be a doped silicon layer formed on the semiconductor substrate.

As shown in FIG. 1C, a top surface of the string channel layer CH may be connected to the bit line BL, and a portion of the bottom end of the string channel layer CH may extend to the inside of the source layer SL. That is, the bottom end of the string channel layer CH may penetrate a portion of the source layer SL. The source layer SL may include a first source layer SL1 and a second source layer SL2 formed on the first source layer SL1.

The first source layer SL1 may surround the bottom end of the string channel layer CH. The second source layer SL2 may be in contact with a sidewall of the string channel layer CH and surround the sidewall of the string channel layer CH.

The outer wall of the string channel layer CH shown in FIG. 1C may be surrounded by a first multi-layered stack ML1 or a second multi-layered stack ML2. Each of the first multi-layered stack ML1 and the second multi-layered stack ML2 may include a tunnel insulating layer, a data storage layer, and a blocking insulating layer.

The tunnel insulating layer is in contact with the outer wall of the string channel layer CH and may be formed in a liner shape. The data storage layer is in contact with the outer wall of the tunnel insulating layer and may be formed in a liner shape. The blocking insulating layer is in contact with the outer wall of the data storage layer and may be formed in a liner shape.

The first multi-layered stack ML1 surrounds the upper sidewall of the string channel layer CH which protrudes from the source layer SL. The second multi-layered stack ML2 is disposed between the first source layer SL1 and the string channel layer CH. The first multi-layered stack ML1 and the second multi-layered stack ML2 may be separated from each other by the second source layer SL2.

Referring to FIGS. 1B and 1C, the bit line BL is electrically connected to the top end of the string channel layer CH and may extend along the second direction II. The conductive patterns CP may be separated from each other by a slit SI. The conductive patterns CP may include a lower select line LSL, word lines WL, and an upper select line USL, which are sequentially stacked along the string channel layer CH.

The lower select line LSL may be disposed between the word lines WL and the source layer SL. The number of lower select lines LSL which is stacked between the word lines WL and the source layer SL may be one, two or more. The upper select line USL may be disposed between the word lines WL and the bit line BL. The number of upper select line USL which is stacked between the word lines WL and the bit line BL may be one, two or more.

Any one or both of the lower select line LSL and the upper select tine USL may have, a smaller width than the word lines WL. For example, two or more rows of string channel layers CH pass through each of the word lines WL while one row of string channel layers CH pass through the upper select line USL. In this case, the upper select line USL may be separated by the slit SI and further separated by an upper slit USI which is formed narrower than each of the word lines WL.

According to the structure described in FIGS. 1B and 1C, memory cells are formed at intersections of the string channel layer CH and the word lines WL, a lower select transistor is formed at an intersection of the string channel layer CH and the lower select line LSL, and an upper select transistor is formed at an intersection of the string channel layer CH and the upper select line USL. A lower select transistor, memory cells, and an upper select transistor, which are arranged in a line along one string channel layer CH, are connected to each other in series through the string channel layer CH, thereby defining a straight-type cell string SCST. The word lines WL may transmit signals to gates of the memory cells, the lower select line LSL may transmit signals to a gate of the lower select transistor, and the upper select line USL may transmit signals to a gate of the upper select transistor.

Each of the semiconductor devices described in FIGS. 1A to 1C includes a three-dimensional cell string structure. A process of forming a stacked structure, a process of forming a hole penetrating the stacked structure, a process of forming a channel layer inside the hole, and the like may be performed to form the three-dimensional cell string structure. In an embodiment of the present disclosure, a stacked structure for a cell string structure may be divided into at least two stacked structures. For example, in the embodiment of the present disclosure the stacked structure for the cell string structure may be divided into a first stacked structure and a second stacked structure disposed on the first stacked structure. In the embodiment of the present disclosure, holes penetrating each stacked structure are formed before an upper stacked structure is formed. For example, in the embodiment of the present invention, a first hole penetrating the first stacked structure is formed, and the second stacked structure is then formed on the first stacked structure.

Subsequently, a second hole penetrating the second stacked structure may be formed and connected to the first hole. According to this process, the degree of difficulty of an etch process for forming a hole can be decreased as compared with the case in which a narrow and long hole is formed by simultaneously etching the first and second stacked structures. In the embodiment of the present disclosure, there is provided a manufacturing method for a semiconductor device, which can decrease the degree of difficulty of the etching process for the first and second holes by sequentially performing the process of forming the first stacked structure, the process of forming the first hole, the process of forming the second stacked structure, and the process of forming the second hole. As a result, the process of forming the second hole may be formed more stably and easily. Hereinafter, a manufacturing method for a semiconductor device according to an embodiment of the present disclosure will be described in detail with reference to FIGS. 2A to 6B.

Figure 2A:
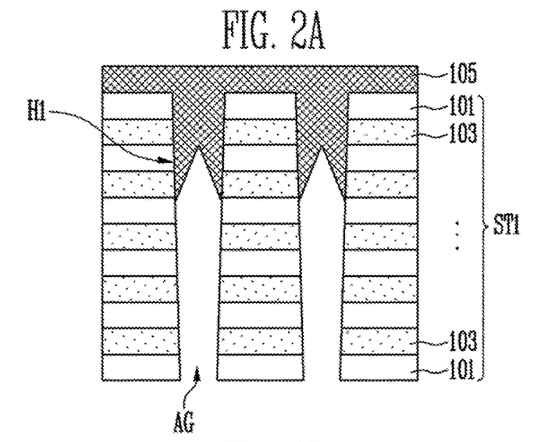

FIGS. 2A to 6B are cross-sectional views illustrating manufacturing method for a semiconductor device according to an embodiment of the present disclosure. FIGS. 2A and 2B are sectional views illustrating a process for forming a reflective metal, which serves as an overlay measurement layer, inside a first hole penetrating a first stacked structure.

Figure 2B:
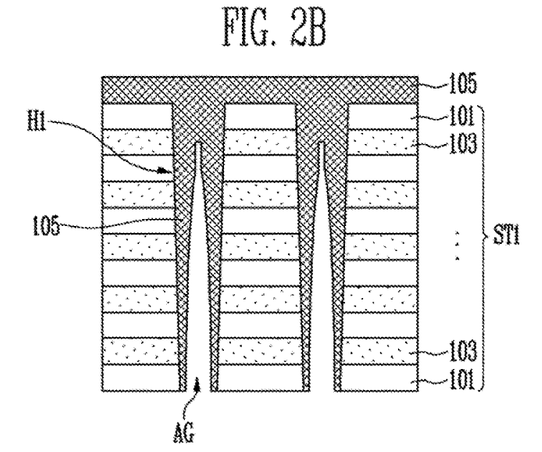

Referring to FIGS. 2A and 2B, first material layers 101 and second material layers 103 are alternately stacked over a lower structure (not shown), thereby forming a first stacked structure ST1.

The lower structure may vary depending on structures of cell strings which will be formed on the lower structure. For example, when the cell string has the structure described in FIG. 1A, the lower structure may include a pipe gate. A trench is formed in the pipe gate and filled with a pipe sacrificial layer. When the cell string has the structure described in FIG. 1B, the lower structure may include a source layer doped with a dopant. When the cell string has the structure described in FIG. 1C, the lower structure may include a stacked structure of a first source layer and a source sacrificial layer.

The first material layers 101 may be formed in a region in which interlayer insulating layers are to be disposed, and the second material layers 103 may be formed in a region in which conductive patterns are to be disposed.

The second material layers 103 are formed of a different material from the first material layers 101. For example the first material layers 101 may be formed of an insulating material for interlayer insulating layers, and the second material layers 103 may be formed of a conductive material for conductive patterns.

Alternatively, the first material layers 101 may be formed of an insulating material for interlayer insulating layers, and the second material layers 103 may be formed of a sacrificial insulating material that is used as a sacrificial material and has a different etching rate from the first material layers 101. In this case, the first material layers 101 may be formed of a silicon oxide layer, and the second material layers 103 may be formed of a silicon nitride layer. When both of the first and second material layers 101 and 103 are formed of an insulating material, it is possible to decrease the degree of difficulty of etching processes for forming holes or slits.

Alternatively, the first material layers 101 may be formed a sacrificial conductive material that is used as a sacrificial material and has a different etching rate from the second material layers 103, and the second material layers 103 may be formed of a conductive material for conductive patterns. In this case, the first material layers 101 may be formed of an undoped polysilicon layer, and the second material layers 103 may be formed of a doped polysilicon layer. When both of the first and second material layers 101 and 103 are formed of a polysilicon layer, it is possible to decrease the degree of difficulty of etching processes for forming holes or slits.

Hereinafter, in the following embodiment, the first material layers 101 are formed of insulating material for interlayer insulating layers and the second material layers 103 are formed of a sacrificial insulating material. However, the present disclosure is not limited thereto.

Subsequently, first holes H1 which are penetrating the first stacked structure ST1 are formed by etching the first material layers 101 and the second material layers 103. After that, a reflective metal 105, which serves as an overlay measurement layer, is formed over the first stacked structure ST1 and extends inside the first holes H1. The reflective metal 105 may be formed of a material having a different etching rate from the first material layers 101 and the second material layers 103. For example, the reflective metal 105 may include tungsten. A process of filling the inside of the first holes H1 with the reflective metal 105 may be simultaneously performed with a process of forming an overlay vernier (not shown). Accordingly, in the embodiment of the present disclosure, it is possible to simplify a manufacturing process for the semiconductor device.

When the reflective metal 105 is completely filled in the first holes H1, tensile stress may be applied to the first stacked structure ST1 by the reflective metal 105. In this case, the first stacked structure ST1 may be deformed, and the positions of the first holes H1 may be changed.

The tensile stress caused by the reflective metal 105 may be reduced by decreasing the volume of the reflective metal 105 filled in the first holes H1. To this end, the reflective metal 105 may be formed into an overhang structure so that the reflective metal 105 partially fills the first holes H1, rather than completely filling the first holes H1. See FIGS. 2A and 2B.

The reflective metal 105 having the overhang structure may be formed using a chemical vapor deposition (CVD) or physical vapor deposition (PVD) method. As the reflective metal 105 is formed into the overhang structure, air-gaps AG may be defined inside the first holes H1.

The reflective metal 105 may be formed at only an upper end of each of the first holes H1 as shown in FIG. 2A. In another embodiment, the reflective metal 105 may be extended on a sidewall of each of the first holes H1, as shown in FIG. 2B. For convenience of illustration, in the following embodiment, the reflective metal 105 is formed into the structure shown in FIG. 2B. However, the present disclosure is not limited thereto.

Figure 3A:
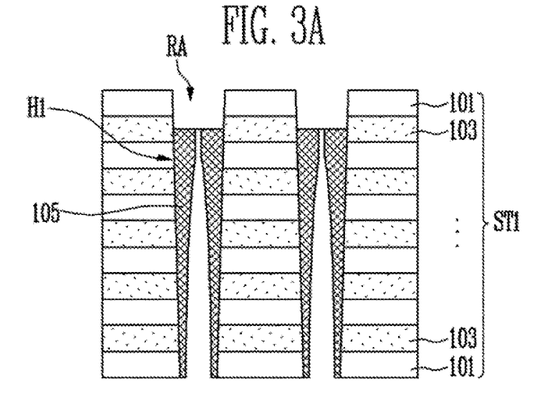
Figure 3B:
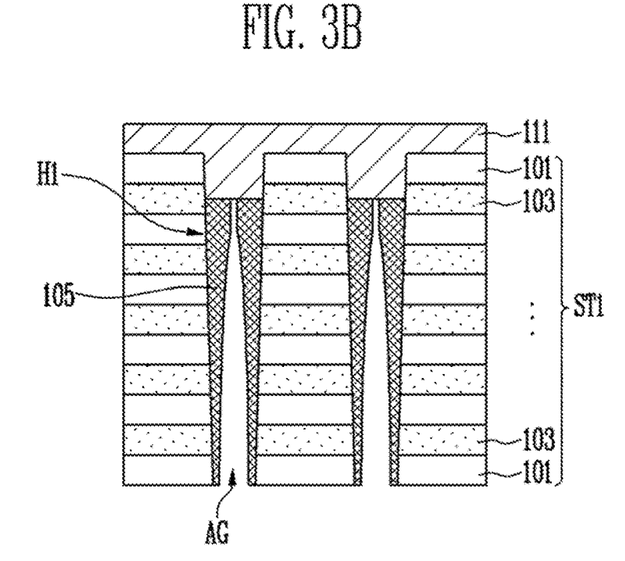
Figure 3C:
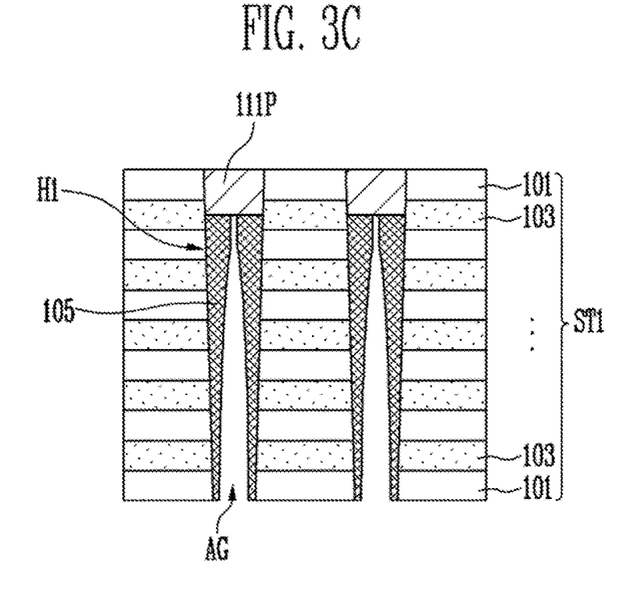

FIGS. 3A to 3C are sectional views illustrating a process for forming an etch stop layer inside the upper end of each of the first holes. Referring to FIG. 3A, a portion of an upper region of the reflective metal 105 is etched using an etch-back process. Accordingly, the upper end of each of the first holes H1 is opened, and a recess area RA from which the reflective metal 105 is removed can be defined at the upper end of each of the first holes H1.

Referring to FIG. 3B, an etch stop layer 111 is formed over the first stacked structure ST1 such that the recess areas RA shown in FIG. 3A are filled therewith. The etch stop layer 111 may have a different etching rate from the first material layers 101 and the second material layers 103. The etch stop layer 111 may be formed of a different material from the reflective metal 105. More specifically, the material for the etch stop layer 111 may be selected by considering the etching selection ratio of the reflective metal 105 with respect to the first stacked structure ST1 or a second stacked structure which will be formed in a subsequent process. The etching selection ratio of the etch stop layer 111 with respect to the first stacked structure ST1 or the second stacked structure may be higher than the etching selection ratio of the reflective metal 105 with respect to the first stacked structure ST1 or the second stacked structure. For example, the etch stop layer 111 may be formed of a titanium nitride layer (TiN).

Referring to FIG. 3C, a surface of the etch stop layer 111 is planarized such that the first stacked structure ST1 is exposed, so that an etch stop layer pattern 111P can remain inside only the recess area RA.

Figure 4A:
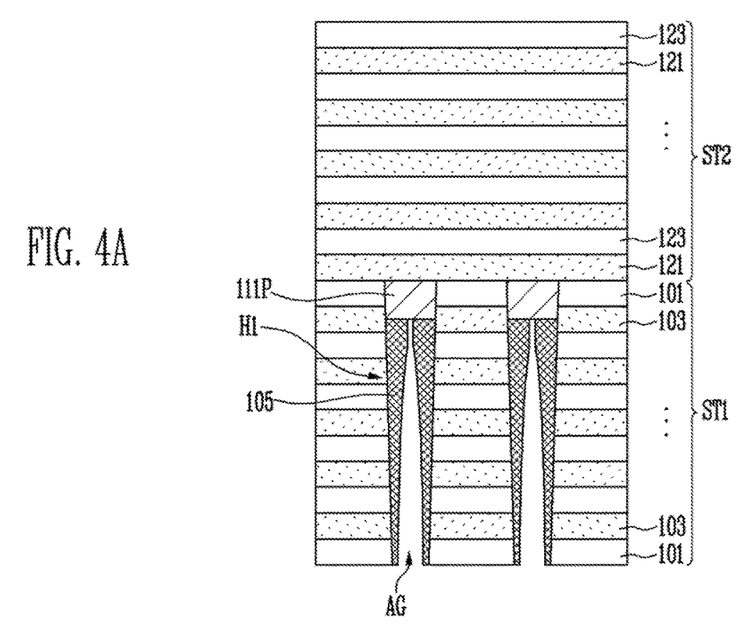
Figure 4B:
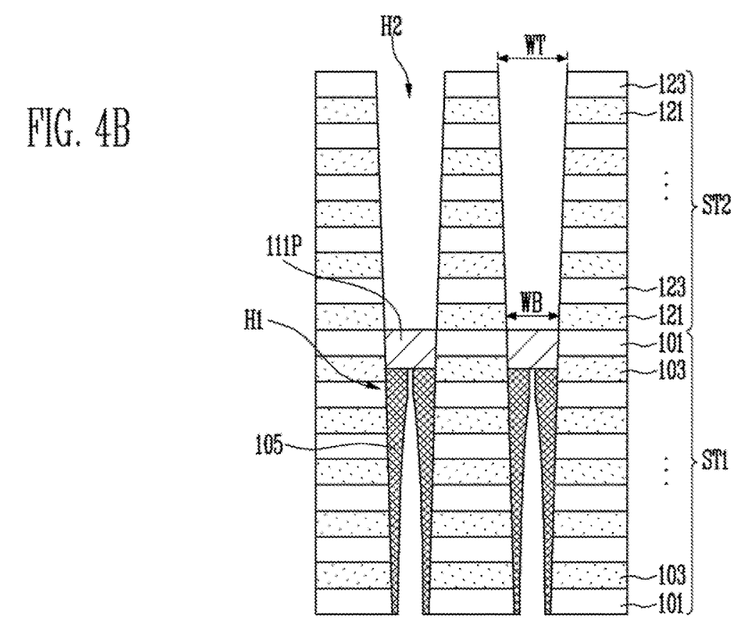

FIGS. 4A and 4B are cross-sectional views illustrating a process for forming a second stacked structure and a process of forming second holes. Referring to FIG. 4A, third material layers 123 and fourth material layers 121 are alternately stacked on the first stacked structure ST1 including the first holes H1 filled with the etch stop layer pattern 111P and the reflective metal 105, thereby forming a second stacked structure ST2. The third material layers 123 may be formed of the same material as the first material layers 101, and the fourth material layers 121 may be formed of the same material as the second material layers 103. Each of the reflective metal 105 and the etch stop layer pattern 111P has a different etching rate from the first to fourth material layers 101, 103, 123, and 121. In addition the etching selection ratio of the etch stop layer pattern 111P with respect to the second stacked structure ST2 is higher than the etching selection ratio of the reflective metal 105 with respect to the second stacked structure ST2.

Referring to FIG. 4B, second holes H2 are formed by etching the third material layers 123 and the fourth material layers 121 to expose the etch stop layer patterns 111P. When an etching process for forming the second holes H2 is performed the etch stop layer pattern 111P having a larger etching selection ratio with respect to the second stacked structure ST2 than the reflective metal 105 may serve as an etch stop layer. Accordingly, the etching selectivity of the second stacked structure ST2 can be increased as compared with when the reflective metal 105 is used as an etch stop layer, and thus a bottom width of the second hole H2 can be formed wide. As a result, in the embodiment of the present disclosure, the difference between the top and bottom widths WT and WB of the second hole H2 can be reduced, and the sidewall profile of the second hole H2 can be almost vertically formed.

Figure 5A:
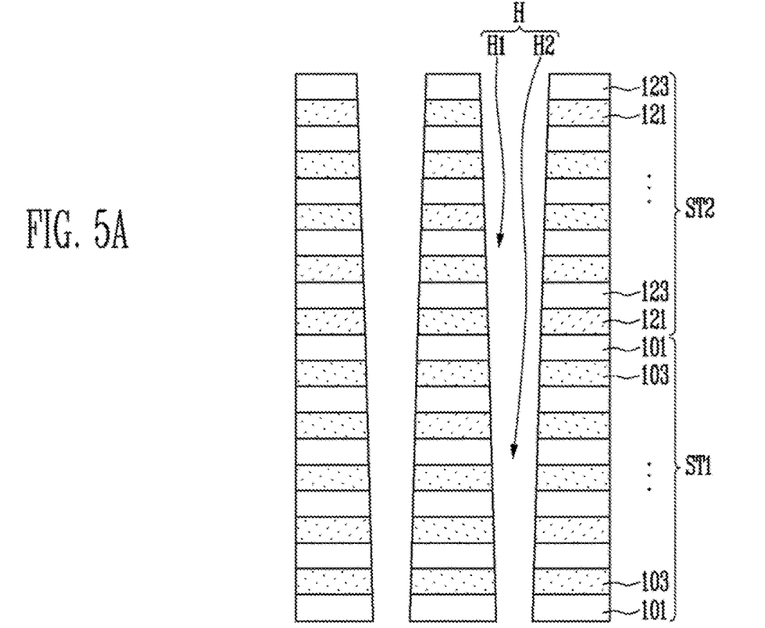
Figure 5B:
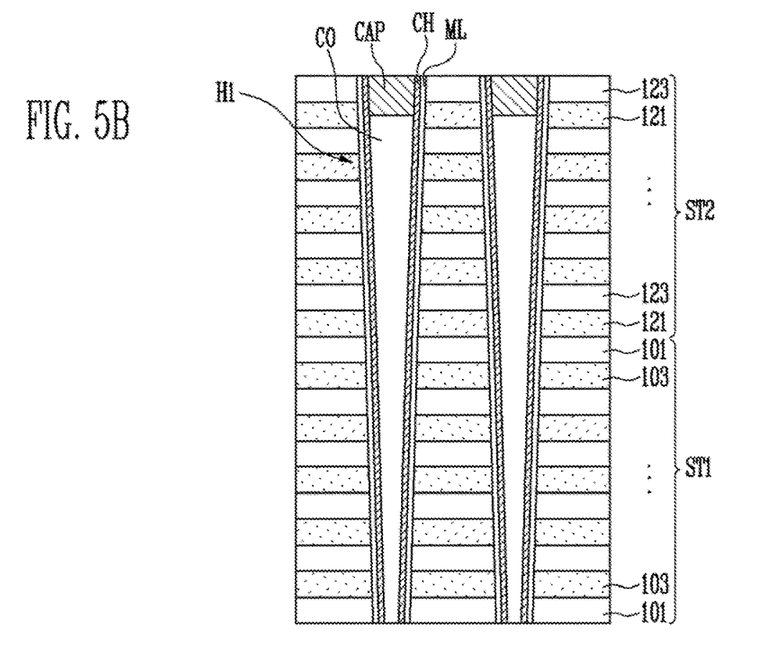

FIGS. 5A and 5B are cross-sectional views illustrating a process for forming a channel layer inside a combined vertical hole which is formed by a connection of the first and second holes.

Referring to FIG. 5A, the etch stop layer pattern 111P and the reflective metal 105, which remain Inside each of the first holes H1, are completely removed through the second holes H2. Accordingly, the first holes H1 are opened, and a pair of first and second holes H1 and H2 which are connected to each other form a vertical hole H.

Referring to FIG. 5B, a multi-layered stack ML is formed on the inner wall of the vertical hole H. The multi-layered stack ML may include a blocking insulating layer formed on the inner wall of the vertical hole H, a data storage layer formed on the blocking insulating layer, and a tunnel insulating layer formed on the data storage layer. The tunnel insulating layer may be formed of a silicon oxide layer, the data storage layer may be formed of a silicon nitride layer in which charges can be trapped, and the blocking insulating layer may be formed of a silicon oxide layer.

Subsequently, a channel layer CH may be formed on the multi-layered stack ML. The string channel layer CH may be formed in a tubular shape and have an opening in a central region of the vertical hole H. In another embodiment, the channel layer CH may completely fill in the vertical hole H. When the channel layer CH is formed in the tubular shape, the central region of the channel layer CH may be filled with a core insulating layer CO. An upper end of the core insulating layer CO, which is disposed inside the vertical hole H, may be partially etched. In this case, a top surface of the core insulating layer CO may be located at a level lower than a top surface of the channel layer CH. An upper end of the vertical hole H may be opened by the partially etched core insulating layer CO. The upper ends of the vertical holes H, opened by the core insulating layer CO, may be filled with a capping layer CAP. The capping layer CAP is in contact with the channel layer CH and may be formed of a doped silicon layer The capping layer CAP may serve as junction regions.

Figure 6A:
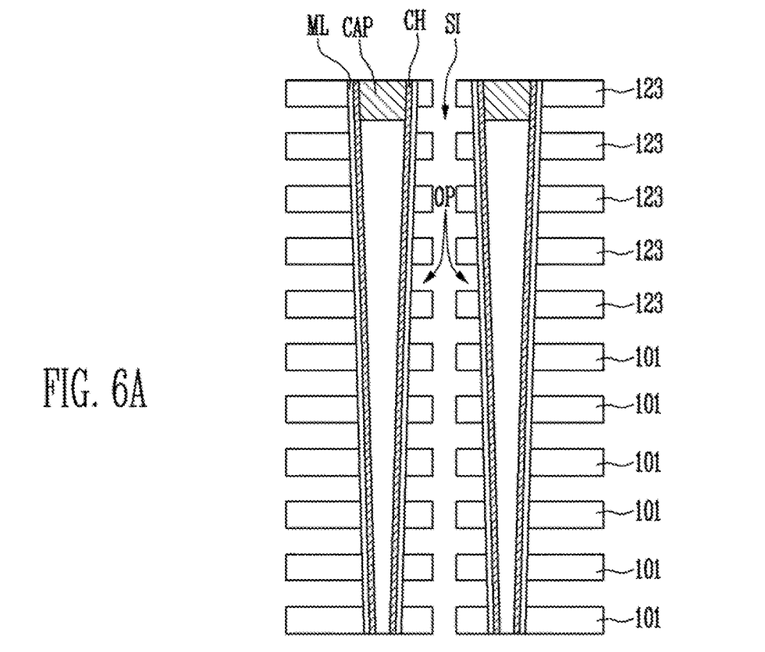
Figure 6B:
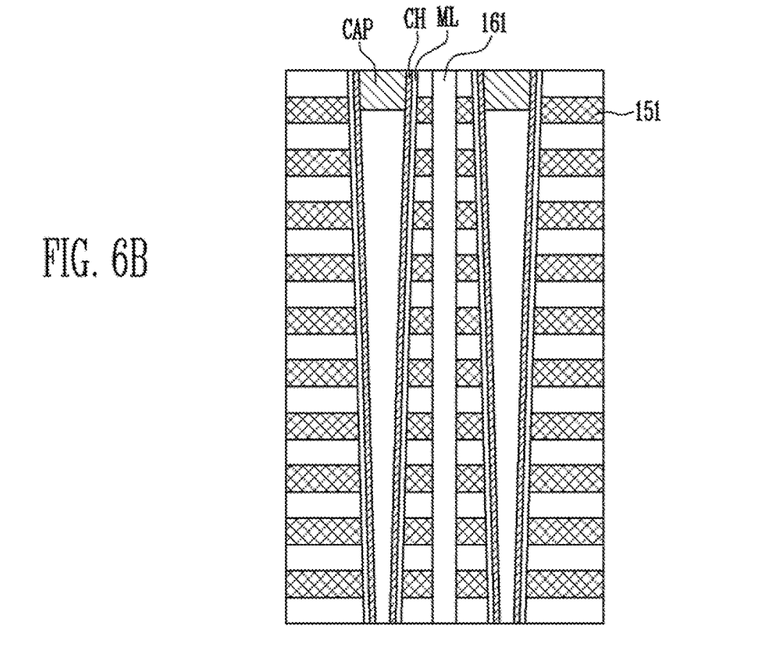

FIGS. 6A and 6B are cross-sectional views illustrating a process for forming a stacked structure of interlayer insulating layers and conductive patterns, which constitute a memory block. Referring to FIG. 6A, the first stacked structure ST1 and the second stacked structure ST2 are etched, thereby forming a slit SI penetrating them. The slit SI may divide the first stacked structure ST1 and the second stacked structure ST2 in units of memory blocks. A process subsequent thereto may vary depending on materials properties of the first to fourth material layers 101, 103 123, and 121.

For example, when the first and third material layers 101 and 123 are formed of insulating layers for interlayer insulating layers, respectively, and the second and fourth material layers 103 and 121 are formed of sacrificial materials, respectively, the second and fourth material its layers 103 and 121 may be selectively removed through the slit SI. Accordingly, openings OP are formed between the first material layers 101 and between the third material layers 123.

Referring to FIG. 6B, the openings OP may be filled with fifth material layers 151, respectively. The fifth material layers 151 may be formed of conductive material for conductive patterns.

When the first and third material layers 101 and 123 are formed of insulating material, and the second and fourth material layers 103 and 121 are formed of conductive material, the first and third material layers 101 and 123 separated through the slit SI may be used as the interlayer insulating layers, and the second and fourth material layers 103 and 121 separated through the slit SI may be used as the conductive patterns.

Alternatively, when the first and third material layers 101 and 123 are formed of sacrificial conductive material, respectively, and the second and fourth material layers 103 and 121 are formed of conductive material for conductive patterns, respectively, the first and third material layers 101 and 123 may be removed through the slit SI, and replaced with the fifth material layers. In this case, the fifth material layers may be formed of insulating material for interlayer insulating layers.

As described above, memory blocks each including interlayer insulating layers and conductive patterns, which are alternately stacked through various processes, can be defined by the slit SI. Subsequently, a slit insulating layer may be filled in the slit SI.

In the embodiment of the present disclosure, the reflective metal for overlay measurement and the etch stop layer are filled in the first hole which penetrates the first stacked structure. Accordingly, in the embodiment of the present disclosure the bottom width of the second hole can be formed sufficiently wide by using a difference in etching selection ratio between the etch stop layer and the second stacked structure. As a result, in the embodiment of the present disclosure, a difference between the top and bottom widths of the second hole can be reduced, and the sidewall of the second hole can be substantially vertically formed. Thus, it is possible to decrease the degree of difficulty of forming material layers over a sidewall of the second hole.

In the embodiment of the present disclosure, the reflective metal, which serves as an overlay measurement, is filled in the first hole. Since the reflective metal provides an additional support in the process of forming the second stacked structure, the stability in the manufacturing process for the semiconductor device can be improved and process defects can be reduced.

In the embodiment of the present disclosure, since the reflective metal serving as an overlay measurement is formed at the same time when an overlay vernier is formed, a manufacturing process is simplified due to the reflective metal.

In the embodiment of the present disclosure, since the reflective metal is formed as an overhang structure, it is possible to reduce tensile stress of the first stacked structure. Thus, it is possible to reduce deformation of the first stacked structure. Accordingly, it is possible to reduce process defects.

Figure 7:
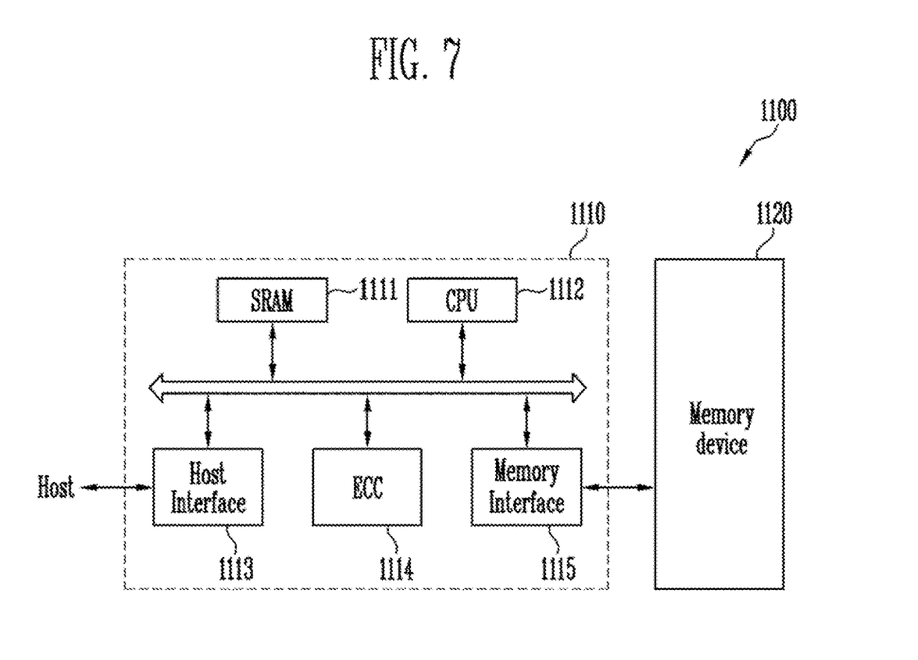
FIG. 7 is a block diagram illustrating a configuration of a memory system according to an embodiment of the present disclosure.

FIG. 7 is a block diagram illustrating a configuration of a memory system according to an embodiment of the present disclosure. Referring to FIG. 7, the memory system 1100 according to an embodiment of the present disclosure includes a memory device 1120 and a memory controller 1110.

The memory device 1120 may include the structures described in FIGS. 1A to 1C and may be formed using the processes described in FIGS. 2A to 6B. The memory device 1120 may be a multi-chip package including a plurality of flash memory chips.

The memory controller 1110 is configured to control the memory device 1120 and may include a static random access memory (SRAM) 1111, a CPU 1112, a host interface 1113, an error correction code (ECC) 1114, and a memory interface 1115. The SRAM 1111 is used as an operation memory of the CPU 1112, the CPU 1112 performs a general control operation for data exchange of the memory controller 1110, and the host interface 1113 includes a data exchange protocol for a host which connected with the memory system 1100. The ECC 1114 detects and corrects an error included in data read from the memory device 1120, and the memory interface 1115 interfaces with the memory device 1120. In addition, the memory controller 1110 may further include a read only memory (ROM) for storing code data for interfacing with the host and the like.

The memory system 1100 configured as described above may be a memory card or a solid state disk (SSD) in which the memory device 1120 is combined with the controller 1110. For example, when the memory system 1100 is an SSD, the memory controller 1100 may communicate with the outside for example, with the host through various interface protocols such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, and an integrated drive electronics (IDE) protocol.

Figure 8:
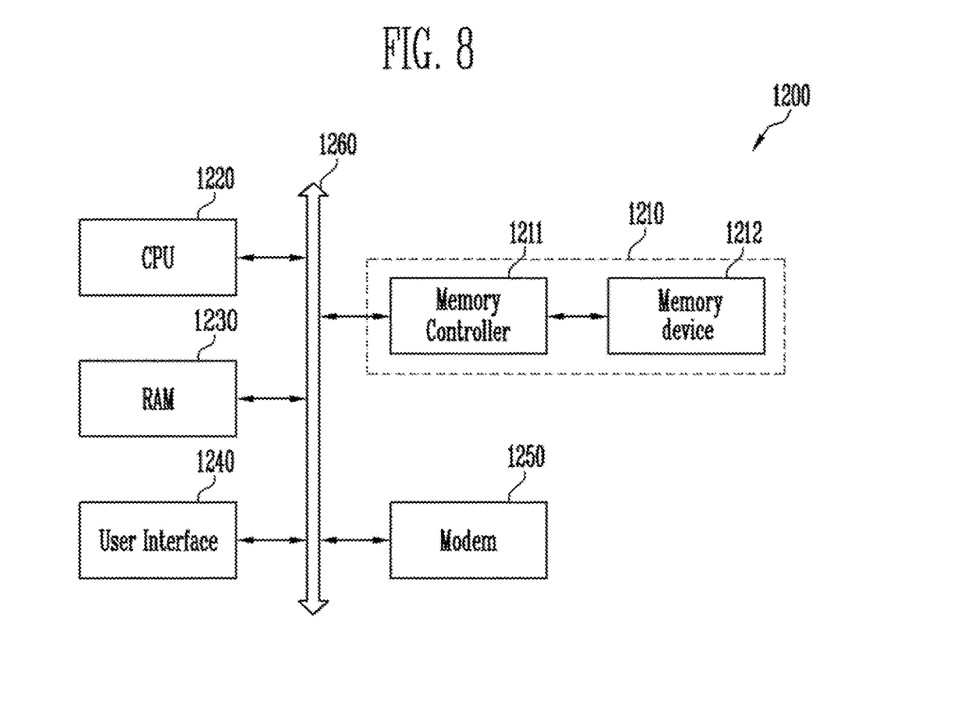
FIG. 8 is a block diagram illustrating a configuration of a computing system according to an embodiment of the present disclosure.

FIG. 8 is a block diagram illustrating a configuration of a computing system according to an embodiment of the present disclosure. Referring to FIG. 8, the computing system 1200 according to the embodiment of the present disclosure may include a CPU 1220 a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included. An application chip set, a camera image processor (CIS), a mobile D-RAM, and the like may be further included.

The memory system 1210, as described above with reference to FIG. 7, may include a memory device 1212 and a memory controller 1211.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a semiconductor device, the method comprising:
   forming a first stacked structure;
   forming a first hole penetrating the first stacked structure;
   forming a reflective metal pattern in the first hole;
   filling an etch stop layer in the first hole and over the reflective metal pattern;
   forming a second stacked structure over the first stacked structure; and
   forming a second hole penetrating the second stacked structure to expose the etch stop layer,
   wherein the first hole includes an air-gap surrounded by the reflective metal pattern and disposed below the etch stop layer.

2. The method of claim 1,
   wherein an etching selection ratio of the etch stop layer over the second stacked structure is higher than an etching selection ratio of the reflective metal pattern over the second stacked structure.

3. The method of claim 1,
   wherein the reflective metal pattern and the etch stop layer are formed of different materials from each other.

4. The method of claim 1, wherein the reflective metal pattern includes tungsten (W).

5. The method of claim 1, wherein the etch stop layer includes a titanium nitride layer (TiN).

6. The method of claim 1, further comprising:
   removing the etch stop layer and the reflective metal pattern from the first hole so that the second hole is coupled to the first hole,
   wherein the first hole and the second hole, in combination, form a combined hole, and
   wherein the combined hole penetrates the first and the second stack structures.

7. The method of claim 6, further comprising:
   forming a multi-layered stack over a sidewall of the combined hole; and
   forming a channel layer over the multi-layered stack.

8. The method of claim 1,
   wherein the first stacked structure includes first material layers and second material layers, which are alternately stacked over each other, and
   wherein the second stacked structure includes third material layers and fourth material layers, which are alternately stacked over each other.

9. The method of claim 8,
   wherein an etching ratio of the reflective metal pattern over the first to fourth material layers is different from an etching ratio of the etch stop layer over the first to fourth material layers.

10. A method of manufacturing a semiconductor device, the method comprising:
    forming a first stacked structure;
    forming a first hole penetrating the first stacked structure;
    forming a reflective metal pattern in the first hole;
    filling an etch stop layer in the first hole and over the reflective metal pattern;
    forming a second stacked structure over the first stacked structure; and
    forming a second hole penetrating the second stacked structure to expose the etch stop layer,
    wherein forming of the reflective metal pattern includes:
    forming a reflective metal layer filling up the first hole; and
    removing an upper portion of the reflective metal layer to form the reflective metal pattern and a first opening, wherein the first opening is formed in the first hole and over the reflective metal pattern, and wherein the etch stop layer is formed in the first opening.

11. The method of claim 10, wherein the reflective metal layer extends over the first stacked structure into the first hole to form an overhang structure in the first hole.

12. The method of claim 10, further comprising:

removing the etch stop layer and the reflective metal pattern from the first hole so that the second hole is coupled to the first hole, wherein the first hole and the second hole, in combination, form a combined hole; and forming a channel layer within the combined hole.

* * * * *